United States Patent
Yasuda et al.

[11] Patent Number: 5,821,795
[45] Date of Patent: Oct. 13, 1998

[54] CIRCUIT FOR CANCELLING THE DC OFFSET IN A DIFFERENTIAL ANALOG FRONT END OF A READ CHANNEL

[75] Inventors: Takeo Yasuda; Hajime Andoh, both of Shiga-ken, Japan

[73] Assignee: International Business Machines Corporation, Armonk, N.Y.

[21] Appl. No.: 797,217

[22] Filed: Feb. 11, 1997

[51] Int. Cl.[6] ........................................ H03L 5/00
[52] U.S. Cl. .......................... 327/307; 327/362; 327/363
[58] Field of Search ............................ 327/307, 306, 327/362, 363, 65, 67, 560, 563

[56] References Cited

U.S. PATENT DOCUMENTS

| | | | |
|---|---|---|---|
| 3,846,710 | 11/1974 | Chapman | 327/553 |
| 4,229,703 | 10/1980 | Bustin | 327/307 |
| 5,491,434 | 2/1996 | Harnishfeger et al. | 327/67 |
| 5,493,246 | 2/1996 | Anderson | 327/307 |
| 5,539,779 | 7/1996 | Nagahori | 327/307 |

*Primary Examiner*—Toan Tran
*Attorney, Agent, or Firm*—H. Daniel Schnurmann

[57] ABSTRACT

An analog front end for signal processing circuit such as a hard-disk data read channel having a calibration circuit for canceling DC offset is described. First, the DC offset is cancelled from a positive phase input to an A/D converter (ADC). Second, a DC offset is cancelled separately from a negative phase input to the A/D converter. The combined positive and negative phases form an amplified analog signal that is used as the differential input to the A/D converter. Finally, the DC offset in a path that encompasses the system analog input through the system digital output is cancelled. Controlling the buffer amplifier bias makes trimming unnecessary. It also enables faster calibration. Further, the two differential phase lines, i.e., the positive phase line and the negative phase line, are each calibrated in turn. As such, a common calibration circuit may be used, thereby avoiding circuit duplication.

10 Claims, 4 Drawing Sheets

CIRCUIT FOR CANCELLING THE DC OFFSET IN A DIFFERENTIAL ANALOG FRONT END OF A READ CHANNEL

FIELD OF THE INVENTION

The present invention is related to canceling the DC offset from an analog signal in real time and, more particularly, to canceling the DC offset in high-speed analog signal processing circuits, such as those that are used internally in the channel of a hard-disk drive.

BACKGROUND OF THE INVENTION

Typically, an analog signal is provided to store data on a magnetic surface or on an optical surface. Data is read from the same type of surface as an analog signal. As such, to use magnetic or optical media as mass storage for a computer, these analog signals must be converted from/to digital data. In reading such an analog signal, the signal is processed by filtering it, amplifying it and reshaping it, though not necessarily in that order. The processed signal is then converted to its digital equivalent. This analog-to-digital and digital-to-analog conversion portion is known as a mass storage Data Read/Write Channel (or channel, in short). Although a channel is, typically, provided with analog and digital function blocks, it may advantageously be integrated in an Integrated Circuit chip (IC).

During analog processing, errors may be introduced in the Read Channel. One such error is the voltage shift or DC offset that raises or lowers the normal peaks or valleys of the analog signal. This unwanted DC offset in the analog signal being processed adversely affects the channel gain, stability, as well as overall quality. At high frequencies, the Analog-to-Digital (A/D) converter operational stability is even more sensitive to DC offset at its input. Therefore, it is desirable to minimize the DC offset prior to the A/D converter (ADC), and before total system DC offset cancellation.

One prior art approach to canceling the DC offset is to block DC. Typically, blocking is done using AC coupling. A coupling capacitor is placed at the output of the analog circuit element, wherein most of the DC offset arises. The blocking can lower DC offset occurring on that line. However, it does remove the DC offset which appears in the former circuit. Thus, blocking is used in the line outside the IC which causes substantially more noise than that caused by internal lines. Further, large capacitors occupy considerable chip real estate, thereby making it unsuited for IC applications altogether. Accordingly, blocking is not a very effective technique for handling DC offset inside a channel.

Circuits having a differential topology are usually robust to common mode noise and to common mode DC offset considerations. On the other hand, there are not effective when the noise or the DC offset differ on both lines, in magnitude and direction. Even for most high speed channels having a differential topology, cancelling the DC offset becomes necessary.

Furthermore, for better signal accuracy, it is advatageous to increase the sensitivity of the ADC. However, an increased ADC sensitivity implies a higher resolution of the ADC. This, in turn, makes the ADC more vulnerable to errors and, particularly, to DC offset or distortion from its input circuit. Thus, in order to achieve better precision, it becomes necessary in any circuit having a differential topology to cancel the DC offset from the analog signal.

FIG. 1 shows a prior art Read circuit of a conventional hard-disk channel that includes means for determining the DC offset and for cancelling the DC offset based on that determination (hereinafter referred to as an offset calibration circuit). An analog input signal is amplified in the Variable Gain Amplifier (VGA) 1, filtered by Low Pass Filter (LPF) 3, and re-amplified in a high-gain Buffer amplifier (BUF) 5. BUF 5 level shifts and improves the driving power of the ADC input circuit. The purpose of this calibration circuit is to eliminate the AC input signal, determine the total system DC offset and, thereafter, subtract the offset within the ADC.

Accordingly, in order to determine the DC offset, first, the input signal must be eliminated. A switch 11 shorts the inputs of VGA 1, forcing the difference on the VGA input (the input signal) to 0. With the input difference at 0, the output of VGA 1 is also at 0. LPF 3 crosses 0 at the output of VGA 1 to BUF 5. It follows that the two outputs of BUF 5 also remain at zero. This means that the outputs should be equal in the middle of the input range of ADC 7. However, VGA 1, LPF 3, and BUF 5 may introduce an unwanted DC offset that shifts the signal reference point from the mid-point of the input range of ADC 7. Thus, with the inputs to VGA 1 shorted, the differential outputs of BUF 5 include the total accumulated offset of VGA 1, LPF 3 and BUF 5. Any DC offset at the output of BUF 5 is further modified by any DC error inherent to the ADC 7.

During calibration, Calibration Logic 9 holds switch 11 closed while monitoring the sign bit of the ADC 7 output, i.e., its Most Significant Bit (MSB) which shows the sign of the output value. A "1" indicates a positive result, while a "0" indicates a negative result. The Calibration Logic also provides ADC 7 with a digital compensation offset value, labeled "Calibration Bit", to compensate for any DC error at the input to or inherent to ADC 7. Although labeled "Calibration Bit", this digital offset value is actually several bits wide.

FIG. 2 is a representation of the prior art Calibration Logic 9 shown in FIG. 1. A Waiting-Time Counter 20 receives a calibration start signal and generates a strobe signal, Strobe 1 therefrom, at intervals greater than 10 $\mu$sec. The strobe signal, Strobe 1, clocks Strobe Generation Counter 22 that counts the number of the strobe pulses, and generates a second strobe (Strobe 2) $2^n-1$ times. Strobe 2 clocks Up/Down Counter 24, which is preset to all "0"s or all "1"s. Up/Down Counter 24 increments or decrements one count depending on the sign bit of the ADC 7 output, at each Strobe 2 pulse. After shorting the input of VGA 1, the Calibration Logic 9 checks the MSB output of ADC 7 within the interval set by Strobe 2. When the MSB of ADC 7 is at a "1", the ADC 7 output is positive. The up/down counter decrements its count, decreasing the Calibration Bit value. When, on the other hand, the MSB of the ADC 7 is at "0", the ADC 7 output is negative and the up/down counter steps up, increasing the Calibration Bit value.

In the aforementioned prior art circuit, the total DC offset must be cancelled witihn ADC 7 by monitoring its output. However, the differential input A/D converter does not work correctly when its inputs have more than two conversion step units of DC offset. More specifically, if the ADC 7 input DC offset exceeds the LSB (Least Significant Bit), the DC offset cannot be properly cancelled. (ADC 7 is designed to work when its two inputs are symmetrical about its point of symmetry. Accordingly, if the two inputs are off 2–3 LSBs from its point of symmetry, ADC 7 will not work properly). Consequently, the DC offset from the VGA 1 inputs to the outputs of BUF 5 must be reduced to <2–3 LSBs, before cancelling the offset in ADC 7. This requirement makes the DC offset specification of VGA 1, LPF 3 and BUF 5 become too stringent.

In addition, to stringent circuit requirements for the elements used in prior art Read Channels, typical A/D converters are slow in responding to changes in its calibration control digital input value. As such, calibration using prior art calibration method, may take more than 10 μsec to stabilize ADC 7 at each new value or step. Consequently, in order to incrementally ramp the calibration value, the step and setting time must be at least 10 μsec for each step. Using this prior art circuit, the calibration input must be stepped $2_n-1$ times (wherein n is an integer representing the calibration input width). Thus, prior art methods become a lengthy procedure, wherein the calibration time is $(2^n-1)\times$ waiting time. By way of example, for a 10 μsec waiting time, a 40-MHz clock and n=6: 10 μsec×40 cycles/ 1 μsec×63= 25,200 cycles are required for calibration, a considerably long time.

OBJECTS OF THE INVENTION

Accordingly, it is an object of the present invention to relax the offset requirement for analog blocks driving an A/D converter (VGA, LPF and BUF) and simplify their design.

A second object of the present invention is to reduce the DC offset calibration time.

SUMMARY OF THE INVENTION

The aforementioned objects of the present invention can be achieved by a method of canceling a DC offset of a differential analog front end circuit in a signal processing system such as a data read channel, the method comprising the steps of: a) cancelling the DC offset at a positive phase buffer output before an analog-to-digital conversion; b) cancelling the DC offset at a negative phase buffer output before analog to digital conversion; the positive phase buffer output and the negative phase buffer output forming a differential amplified analog signal; and c) converting the amplified analog signal to a single ended digital signal and cancelling a DC offset from the total analog path based on the digital signal.

Thus, the two differential phase lines, the positive phase line and the negative phase line, are each calibrated. Prior to the total system DC offset calibration, the first and second steps are executed sequentially, so that a common calibration circuit may be used, avoiding element duplication.

After the first two calibration steps, the DC offset at the input of the A/D converter is suppressed within 2–3 bits of equivalent its output level. In addition, because buffer amplifiers are much more responsive to input variations than the A/D converter, much less settling time is required at each incremental change in calibration voltage than in prior art methods. Furthermore, calibration ends when the final calibration value is determined, and not after generating all the $2^n-1$ strobe pulses, as in the prior art. Thus, the present invention provides higher-speed calibration.

DESCRIPTION OF THE PREFERRED EMBODIMENT

Figure 3:
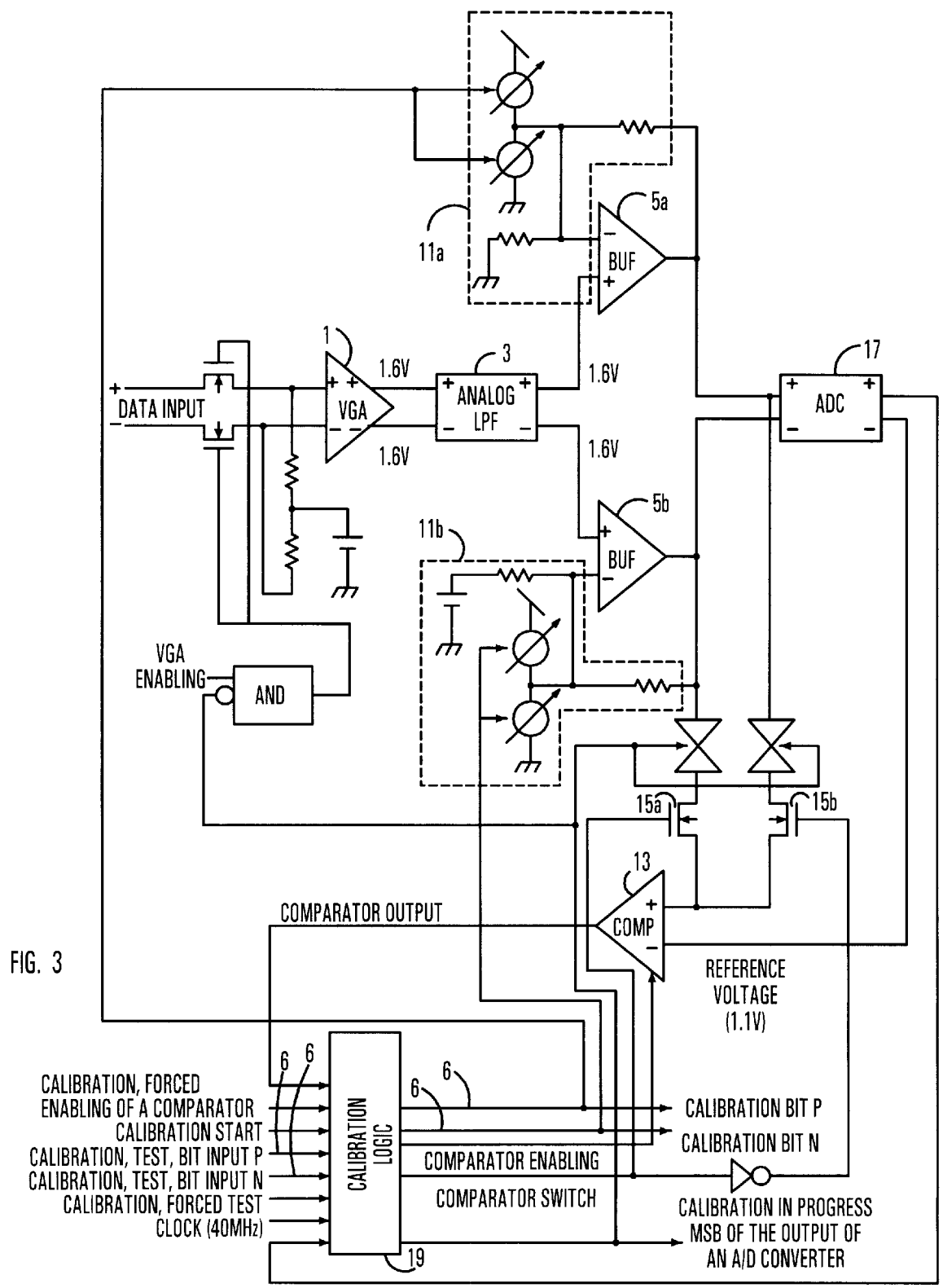
FIG. 3 is a diagram of a system with a calibration circuit for cancelling the DC offset of an analog signal, in accordance with the present invention.

FIG. 3 depicts an analog-to-digital (A/D) data path of Read Channel, according to the present invention, wherein positive and negative differential outputs from LPF 3 are buffered independently in BUF 5a and 5b. According to the present invention, the Calibration Logic 19 individually controls the bias input to each buffer amplifier 5a and 5b. Thus, each buffer amplifier is calibrated separately.

The present invention cancels the total system offset in three steps. After shorting the input of VGA 1, the positive phase line from buffer amplifier 5a is set to a fixed voltage by adjusting its bias control circuit 11a. Second, the negative phase line from buffer amplifier 5b is set to the same fixed voltage in a similar manner, with bias control circuit 11b. Now, the total DC offset of the positive and negative lines through VGA 1, LPF 3 and BUF 5a and 5b is cancelled, leaving only the DC offset of ADC 17. The output of ADC 17 is the A/D conversion of the difference of its two differential inputs (or of the two adjusted lines). Third, the calibration bits for the BUF 5b on the negative side (or, alternatively, the positive phase side) is adjusted again until the output of the ADC 17 is at 0 (at the middle of its output range). This is determined by monitoring the MSB of ADC 17. In all steps, only BUF 5a and BUF 5b internal biases are adjusted, even if other blocks have a considerable DC offset. After the final steps, the output of BUF 5a may differ from that of BUF 5b. The entire analog path DC offset error is cancelled by adjusting only bias control circuit 11a and 11b. This method is much faster than prior art Read Channel DC offset calibration because of the faster response of BUF 5 to bias shifting.

Figure 4:
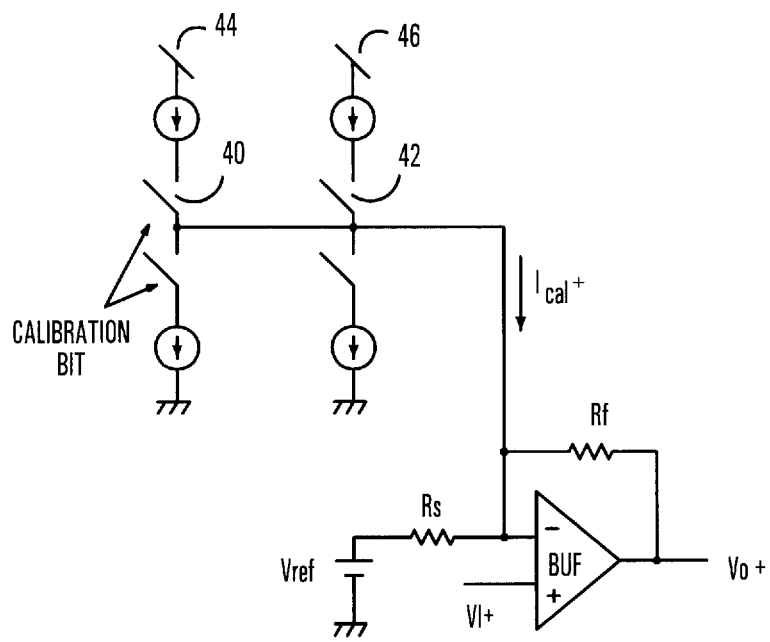
FIG. 4 is a detailed block diagram of an ADC input point calibration circuit and a buffer amplifier, according to the present invention.

FIG. 4 is a schematic of Buffer Bias Control Circuit 11a and BUF 5a of FIG. 3, which is identical to Buffer Bias Control Circuit 11b and BUF 5b. Each Bias Control Circuit 11a and 11b sets a bias value for BUFs 5a and 5b, respectively. Calibrating the DC offset of the Read Channel, according to the present invention, through BUFs 5a and 5b is described hereinafter with reference to FIGS. 3 and 4. The differential inputs to ADC 17 are the outputs of BUFs 5a and 5b, which are calibrated individually and in sequence to provide the appropriate voltage when the channel input (i.e., input to VGA 1) is at 0.

As shown in FIG. 4, each Calibration Control Bit P or N from the Calibration Logic 19 to the Bias Control Circuit 11a or 11b controls several switches between 40 and 42 for switching, either by pushing or by pulling the current with proportional reference current sources between 44 and 46. Each reference source between 44 and 46 is proportional to the individual control bit significance. The sum of these selected currents form current I⁺cal and I⁻cal in the negative feedback path of BUF 5a and 5b, respectively. Thus, the Calibration Bits P and N set the bias current in circuits 11a and 11b. The analog signal path positive phase line through BUF 5a and negative phase line through BUF 5b are each calibrated individually. Thus, during calibration in the first or the second steps, switch 15a or 15b selects the buffer output of whichever buffer 5a or 5b is being calibrated. The selected output is passed to the positive input of comparator 13. This comparator input voltage is compared to a reference voltage from the ADC 17 (at the middle of ADC 17 input range). This reference line is connected directly to the comparator 13 negative input.

Figure 5:
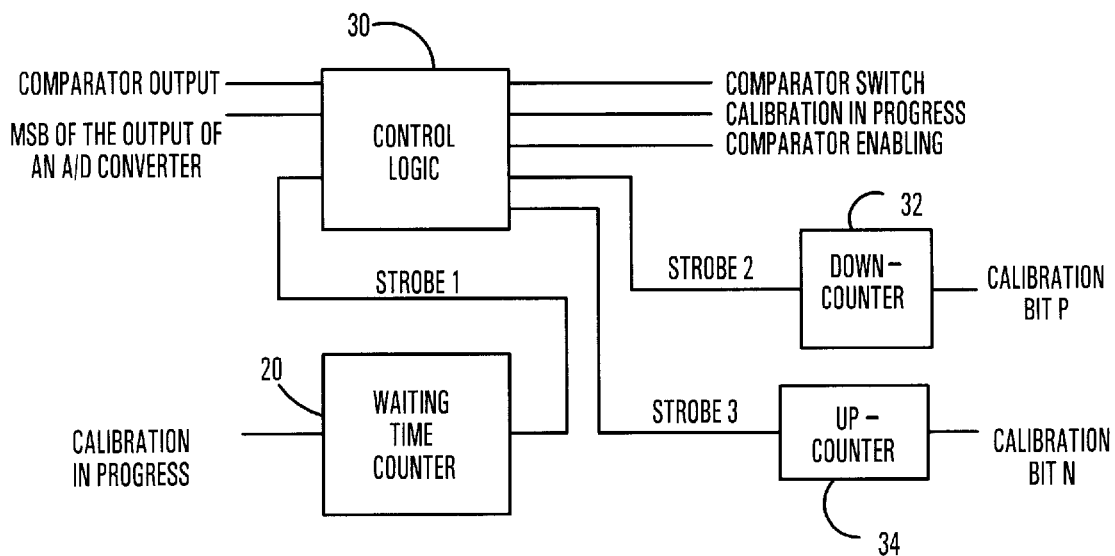
FIG. 5 is a block diagram of calibration control logic, according to the present invention.

FIG. 5 is a block diagram of Calibration Logic 19 of the preferred embodiment of the present invention. Instead of using a Strobe Generation Counter 22, as done in prior art, in the present invention, two strobe signals, Strobe 2 and Strobe 3, are generated by Control Logic 30. Strobe 1, generated by waiting-time counter 20, is an input to Control Logic 30 and is selectively passed to Down-Counter 32 as Strobe 2, or to Up-Counter 34, as Strobe 3. During the positive phase calibration, Down-Counter 32 decrements the positive calibration control word from $2^n-1$, e.g., from 63 when n=6, n being the Calibration Bit width. Individual positive calibration control bits (collectively labelled "Calibration Bit P") cause selected switches in Bias Control Circuit 11a to open or close adjusting bias current $I^+$cal. During the negative phase calibration, Up-Counter 34 increments the negative calibration control word from 0. Individual negative calibration control bits (collectively labelled "Calibration Bit N") cause selected switches in Bias Control Circuit 11b to open or close, adjusting bias current $I^-$cal. As it respectively decreases or increases, the corresponding positive or negative phase line output from BUF 5a or 5b is selectively passed to comparator 13 through switch 15a or 15b.

The output of Comparator 13 and the MSB output of ADC 17 are fed-back as inputs to Control Logic 30. During P (or N) phase line calibration, each Calibration Bit P (or N) is passed to selected BUF 5a (or 5b) for subsequent, iterative calibration. Thus, during P or N buffer outputs calibration, the comparator output reflects whether the calibration value sets the bias such that the buffers output are above or below the reference voltage. After the phase lines calibration with BUF 5, the A/D converter is calibrated by adjusting one of the BUF 5 Calibration Bits, while monitoring the ADC 17 MSB.

Control Logic 30 provides a Comparator Switch signal, a Calibration-In-Progress signal and a Comparator Enabling signal. The Comparator Switch Signal selects whether the output of the positive or negative BUF 5a or 5b is passed to the comparator through FETs 15a or 15b, respectively. The Calibration-In-Progress signal is, effectively, a busy signal which shorts the input of VGA1 throughout the calibration period. This signal is used to detach the calibration circuits from the main path after calibration is completed to reduce parasitic capacitance at the input of ADC 17. Comparator Enabling signal is active and, for power saving considerations, enables the Comparator only during first two steps calibration.

In the calibration circuit of the present invention, the strobe (Strobe 2 or Strobe 3) signal generation ends at each step and after the calibration of each circuit is completed. Following the first and second steps (STEP1 and STEP2), the difference between the positive phase input signal and the negative phase input signal of ADC 17 are within the ADC 17 warranted margin of input error, i.e., 2–3 LSBs of the reference voltage. This ensures a correct operation of ADC 17 in the last step (STEP3). The present invention changes the DC bias inside BUF 5, instead of ADC 17. Therefore, it is much faster than prior art circuits, because the present invention takes full advantage of the fact that the buffer is significantly more responsive to internal bias changes than the A/D converter, i.e., wherein the settling time is of the order of 1 μsec. Therefore, the required calibration time for the present invention is at least 10 times shorter (<1/10) than that of the prior art circuit.

Figure 6:
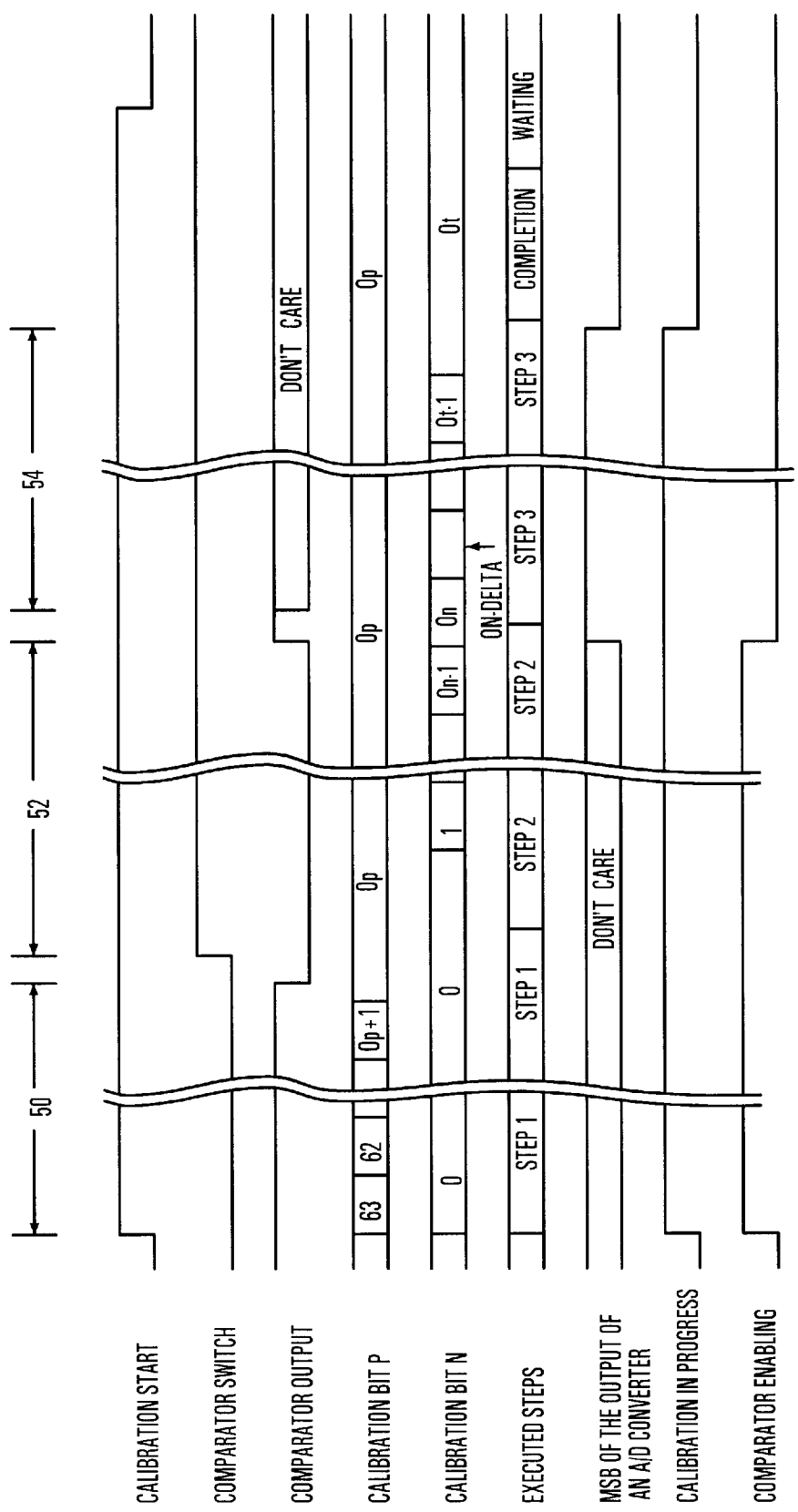
FIG. 6 is a timing diagram for the calibration control circuit shown in FIG. 5.

FIG. 6 is a timing diagram for the Calibration Logic shown in FIG. 5. First, the positive phase is calibrated during period 50 (STEP1). The positive phase calibration step begins when Offset Calibration Start signal rises, generating Strobe 1, i.e., the clock pulses with the time interval of buffer settling time (≈1 μs). The Comparator Enabling signal is driven to enable Comparator 13. Strobe 1 generates Strobe 2, which clocks Down-Counter 32, decreasing Calibration Bit P from 63. When BUF 5a output V, (i.e., the positive phase output) reaches the target voltage of 1.1 V (the reference voltage provided by ADC 17), the Comparator output switches to indicate that positive phase calibration is complete. The Calibration Bit P has a value $O_p$, which shifts the output of BUF 5a to the target voltage. The Comparator Switch Control signal is held at a low during step 50 (STEP1) by keeping switch 15a closed while 15b remains open, so that the output of BUF 5a is passed to Comparator 13 for comparison against the reference voltage. Once the Comparator output switches, $O_p$ has been determined, and step 52 (STEP2), i.e., the negative phase calibration step begins. Switching the comparator output halts Strobe 2 (Clamping Control Bit P at $O_p$) and starts Strobe 3. At the same time, the Comparator Switch signal is forced to a high, closing the switch 15b and opening 15a. This signal passes the output of BUF 5b to Comparator 13 for comparison against the same target voltage of STEP1. Strobe 3 clocks counter 34 increases the Calibration Bit N from 0. When BUF 5b generates an output, the negative phase output is driven to the target reference voltage from ADC 17. The output of Comparator 13 switches, indicating that the negative phase calibration is complete. Calibration Bit N is $O_n$, which shifts the output of BUF 5b to the target value. Once the output of BUF 5b detected by comparator 13 is equal to the target reference voltage, Calibration Bit N holds the appropriate value $O_n$. Now, both positive and negative phase outputs are equal and STEP2 (52) is complete. At the end of STEP2, Calibration Bit P is $O_p$ and Calibration Bit N is $O_n$.

In the third step 54 (STEP3), the total system (from the input of VGA 3 to the output of ADC 17) offset calibration step, the Calibration Bit N is varied from $O_n$ while holding the Calibration Bit P constant at $O_p$ until the output of ADC 17 is 0 (at mid-range). Once STEP3 begins, Comparator 13 is disabled by forcing the Comparator Enabling signal to a low. Instead of monitoring the output of Comparator 13 (BUF 5 output), the MSB of the output of the ADC 17 is monitored during STEP3. Next, Calibration Control Bit N is iteratively increased/decreased until the output of ADC 17 reaches 0. (Having the MSB—the largest bit of the word—at the output of ADC 17 at 1, for a positive value, and at 0, for a negative value, the MSB is advantageously used to detect a 0 condition). With the output of ADC 17 at 0, system calibration is complete and the negative Calibration Bit N holds a new value $O_t$ and Calibration Bit P the value $O_p$, forcing the output of ADC 17 to 0. Alternatively, Calibration Bit N could have been held constant and Calibration Bit P varied to find an appropriate calibration value for total system calibration. Regardless which approach is taken, at the end of the third and final step 54 (STEP3), Calibration Bit P is at $O_p$ and the Calibration Bit N is at $O_t$. Calibration is complete and the Read Channel is ready for normal operation.

Referring now to FIG. 4, the relationship between the offset voltage and the buffer amplifier input, $V_o^+$ and $V_i^+$, is given by:

$$V_0^+ = \frac{R_f + R_a}{R_a} V_i^+ - \left( I_{cal}^+ \times R_f + V_{ref} \frac{R_f}{R_s} \right) \qquad (1)$$

Thus, if the target voltage of step 1 is $V_{ts1}$ then, setting $V_o^+ = V_{ts1}$ and solving for $V_i^+$:

$$V_i^+ = \frac{R_s}{R_f + R_s} \left( V_{ts1} + I_{cal}^+ \times R_f + V_{ref}\frac{R_f}{R_s} \right) \quad (2)$$

Similarly, if the target voltage of step 2 is $V_{ts2}$, then setting $V_o^- = V_{ts2}$ and solving for $V_i^-$:

$$V_i^- = \frac{R_s}{R_f + R_s} \left( V_{ts2} + I_{cal}^- \times R_f + V_{ref}\frac{R_f}{R_s} \right) \quad (3)$$

The allowable DC offset value $V_i^+ - V_i^-$ in the buffer amplifier inputs when $V_{ts1} = V_{ts2}$, is:

$$V_i^+ - V_i^- = \frac{R_f \times R_S}{R_f + R_S} (I_{cal}^+ - I_{cal}^-) \quad (4)$$

Then, with $|I_{cal}^+| \leq$ (maximum number of steps)× (decremental value in $I_{cal}^+$ in one step) and $|I_{cal}^-| \leq$ (maximum number of steps)×(incremental value of $I_{cal}^-$ in one step) for the values in FIG. 4, $|I_{cal}^+ - I_{cal}^-| \leq (31)(9)(2) = 558$ μA. Thus, the calculated maximum offset value $|V_i^+ - V_i^-| \approx 50$ mV. This indicates that the circuit is able to cancel up to ≈50 mV differential DC offset at the input of BUF 5a and BUF 5b. The minimum step voltage of this circuit is 8 mV=(the decremental or incremental value of $I_{cal}^+$ or $I_{cal}^-$ in one step)×$R_f$. Thus, it can control the differential DC offset at the input of the ADC 17 with half the resolution of ADC 17 1 LSB (=16 mV).

In the present invention, after the first and second steps, the differential DC offset at the input of the ADC 17 can be suppressed within ±½ LSB, as long as the initial differential DC offset at the input of BUF 5a and BUF 5b is <50 mV. During STEP1 and STEP2, the output of ADC 17 is not monitored. Thus, these steps work correctly even when ADC 17 does not. Before the final step (STEP3), the differential offset at the input of ADC 17 (the difference of positive phase line and negative phase line) is within ±½ LSB. If it is <2–3 LSBs, then ADC 17 works correctly. Now, in STEP3, the calibration circuit can cancel the differential DC offset of total system within ±½ LSB by monitoring the output of ADC 17.

Figure 1:
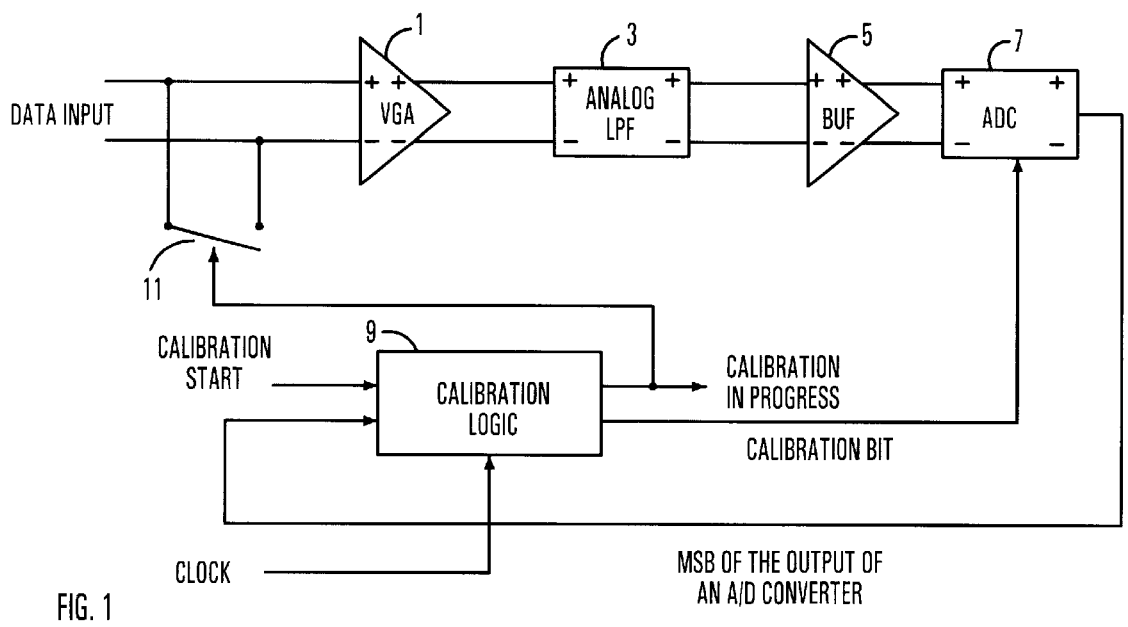
FIG. 1 is a block diagram showing a prior art system having an A/D converter circuit with a calibration circuit for canceling the DC offset of an analog signal.
Figure 2:
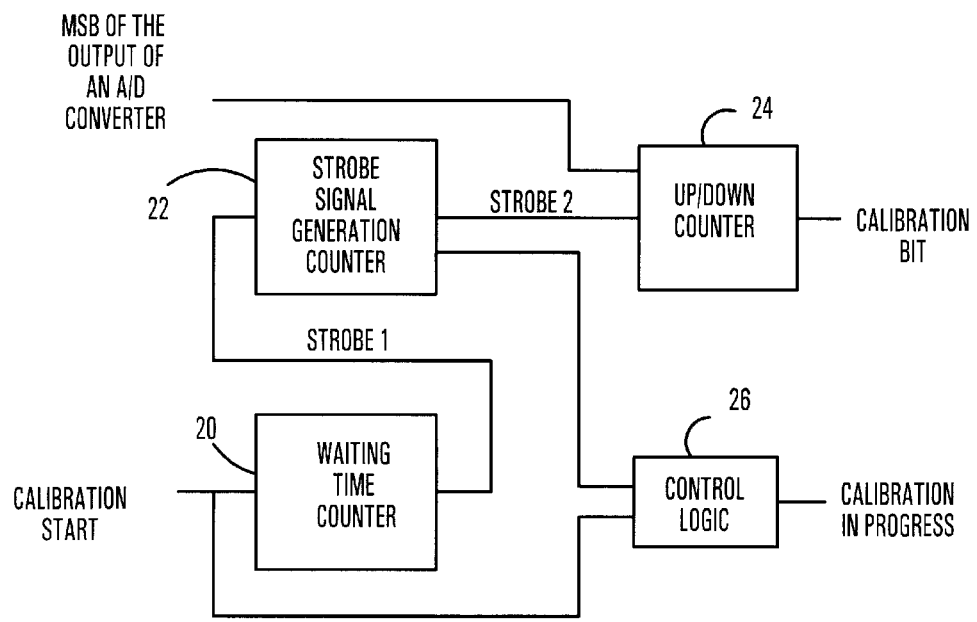
FIG. 2 is a block diagram showing a calibration control logic of the prior art system of FIG. 1.

By contrast, prior art controls ADC 7 bias by monitoring its output from the start. Thus, the initial differential DC offset at the input of ADC 7 should be <2–3 LSBs, i.e., 48 mV=3 LSB×16 mV. It means that the DC offset at the input of BUF 5 is <4.8 mV (i.e., 48 mV/10), if the gain of BUF 5 amplifier is 10. This is less than one-tenth of 50 mV, which holds true for the present invention. Thus, FIG. 1 (prior art) yields a much stringent DC offset requirement for VGA 1, LPF 3 and BUF 5. A post-production adjustment process, such as fuse trimming, is needed for prior art circuits VGA 1, LPF 3 and BUF 5, before DC offset calibration.

In present invention, offset requirements for these circuit are not as severe. Fine adjustments, such as with fuse trimming, are not required altogether. This saves chip area and reduces test cost drastically. Without any fine adjustments, the differential DC offset can be suppressed to within ±½ the ADC incremental unit LSB. In addition, Read Channel DC offset calibration by controlling bias inside buffer amplifier is much faster than by controlling the bias on the ADC, as done in the prior art. Generating $2^n - 1$ strobes, as in prior art, is unnecessary. Calibration ends when the desired calibration values are found, further shortening calibration time. The same Comparator is used in the first and second step to avoid duplication.

While the present invention is described in terms of a preferred embodiment, it is understood that numerous variations and modifications will occur to a person skilled in the art without departing in spirit from the claimed invention. It is intended that the scope of the claims include those modifications and variations that fall within the spirit of the invention.

What is claimed is:

1. In a signal processing system, a method of canceling a DC offset of an analog signal having a positive phase and a negative signal outputted by a differential analog circuit having a positive phase buffer for buffering said positive phase analog signal and a negative phase buffer for buffering said negative phase analog signal, said method comprising the steps of:
   a) cancelling the DC offset of a signal at an output of said positive phase buffer;
   b) cancelling the DC offset of a signal at an output of said negative phase buffer,
   said signal at said positive phase buffer output and said signal at said negative phase buffer output resulting in a differential amplified analog signal;
   c) converting said differential amplified analog signal to a single ended digital signal having a DC offset; and
   d) cancelling said digital signal DC offset.

2. The method of claim 1, wherein said step (c) further comprises:
   adjusting the output of said positive phase buffer in response to said digital signal until said DC offset from said digital signal is totally cancelled.

3. The method of claim 1, wherein said step (c) further comprises:
   adjusting the output of said positive phase buffer in response to said digital signal until said DC offset from said digital signal is totally cancelled.

4. The method of claim 1, wherein said positive phase buffer output and said negative phase buffer output are respectively compared against a reference voltage.

5. The method of claim 4, wherein said positive phase buffer and said negative phase buffer are provided with a common said reference voltage.

6. A Differential Analog Front End for a Read Channel, comprising:
   means for receiving an analog signal having a positive phase and a negative phase;
   first amplifier means for amplifying said positive phase of said received analog signal;
   second amplifier means for amplifying said negative phase of said received analog signal;
   means for converting a difference signal to a digital value, said difference signal being the difference between said positive and said negative phases of said received analog signal; and
   calibration means for independently calibrating each of said first amplifier means and said second amplifier means for cancelling a DC offset of said amplified positive phase analog signal, said amplified negative phase analog signal, and said converted digital value output.

7. The Differential Analog Front End for a Read Channel of claim 6 wherein the calibration means provides a digital value to each of said first amplifier and said second amplifier.

8. The Differential Analog Front End for a Read Channel of claim 6 wherein said first and second amplifier means, each includes reference means for setting a bias voltage responsive to said amplified output.

9. The Differential Analog Front End for a Read Channel of claim 8 wherein said calibration means provides a digital value to said reference means, said digital value setting said bias voltage.

10. The Differential Analog Front End for a Read Channel of claim 6 wherein the calibration means further comprises:

means for selectively comparing an output from said first means or second amplifier means against a reference voltage; and means for adjusting a bias voltage in said first or said second amplifier means to cancel the DC offset of said converted digital value output.

* * * * *